(12) United States Patent
Kim et al.

(10) Patent No.: US 9,116,217 B2
(45) Date of Patent: Aug. 25, 2015

(54) APPARATUS AND METHOD FOR RECONSTRUCTING 3D IMAGE BY USING MAGNETIC RESONANCE IMAGING

(75) Inventors: Dong-Hyun Kim, Seoul (KR); Min-Oh Kim, Seoul (KR); Sang-Young Zho, Gyeongsangnam-do (KR)

(73) Assignee: Industry Academic Cooperation Foundation, Yonsei University, Seoul (KR)

( * ) Notice: Subject to any disclaimer, the term of this patent is extended or adjusted under 35 U.S.C. 154(b) by 608 days.

(21) Appl. No.: 13/458,659

(22) Filed: Apr. 27, 2012

(65) Prior Publication Data

US 2012/0280684 A1   Nov. 8, 2012

(30) Foreign Application Priority Data

May 6, 2011   (KR) .................. 10-2011-0043029

(51) Int. Cl.
| | |
|---|---|
| *G01R 33/483* | (2006.01) |
| *G01R 33/48* | (2006.01) |
| *G01R 33/563* | (2006.01) |
| *G01R 33/565* | (2006.01) |

(52) U.S. Cl.
CPC ........ *G01R 33/4833* (2013.01); *G01R 33/4818* (2013.01); *G01R 33/4822* (2013.01); *G01R 33/563* (2013.01); *G01R 33/56545* (2013.01); *G01R 33/56563* (2013.01)

(58) Field of Classification Search
CPC .. G01R 33/4833; G01R 33/35; G01R 33/563; G01R 33/4822; G01R 33/56545; G01R 33/56563; G01R 33/4818
See application file for complete search history.

(56) References Cited

U.S. PATENT DOCUMENTS

| | | | | |
|---|---|---|---|---|
| 4,796,635 | A * | 1/1989 | Dumoulin | 600/413 |
| 5,022,397 | A * | 6/1991 | Dumoulin | 600/413 |
| 5,025,788 | A * | 6/1991 | Dumoulin | 600/413 |
| 5,038,783 | A * | 8/1991 | Dumoulin | 600/419 |
| 6,043,652 | A * | 3/2000 | Liu | 324/309 |
| 6,134,464 | A * | 10/2000 | Tan et al. | 600/410 |
| 7,983,462 | B2 * | 7/2011 | Sauer et al. | 382/131 |

* cited by examiner

*Primary Examiner* — Dixomara Vargas
(74) *Attorney, Agent, or Firm* — TechLaw LLP (57) ABSTRACT

An apparatus for reconstructing 3D images by using magnetic resonance imaging (MRI) includes an image acquiring unit configured to acquire a plurality of MR images about a region of interest of an object at different angles, respectively; and an image reconstructing unit configured to reconstruct the 3D image by using the plurality of MR images, wherein the plurality of MR images include information of a slice direction about the region of interest, which is changed depending on the different angles. According to the invention, since the 3D image is reconstructed by using the MR images acquired at different angles, the 3D image may have a better SNR than the method for reconstructing 3D images of the related art.

9 Claims, 12 Drawing Sheets

FIG. 1

PRIOR ART

APPARATUS AND METHOD FOR RECONSTRUCTING 3D IMAGE BY USING MAGNETIC RESONANCE IMAGING

TECHNICAL FIELD

Embodiments of the invention relate to an apparatus and a method for reconstructing a 3-dimensional (3D) magnetic resonance imaging (MRI), and more particularly, to a method for reconstructing 3D images with a plurality of 2D MR images acquired at different angles.

BACKGROUND ART

MRI is a noninvasive imaging technique that provides clinicians and diagnosticians with information regarding anatomical structures and statuses of a region of interest inside a patient's body.

Generally, MRI is applied to imaging of an examination area where a patient to be examined is located with an almost uniform main magnetic field B0. A magnetic dipole, which is selected in the patient by exciting and operating a radio frequency (RF) magnetic field B1 (if not, it is arranged parallel with the main magnetic field), is excited and inclined by the magnetic resonance. The resonance is controlled to induce a detectable magnetic resonance echo signals from the selected region of the patient. The spatially encoded echo signal is formed by applied gradient fields. A raw data transmitted from an MRI scanner has frequency information and is collected in a 2- or 3-dimensional matrix form of a frequency region which is known as a k-space. The patient's images are reconstructed from the frequency data through the 2D or 3D inverse Fourier transform, or the other well-known reconstruction techniques.

MR imaging of the related art generates a data volume consisting of voxels with 3D features. Sizes of the voxels are decided by physical features of the MRI scanner as well as user's settings.

Recently, 3D information is used for creating diagnosis and treatment. This is why 2D images in blood vessel images simply show thin slides of a blood vessel and make it difficult to diagnose stenosis or other disorders, for example.

In general, a 3D image is obtained by piling the 2D images, which are combined in order to create a volume image, or by using 3D image-acquiring techniques.

If the voxel volume is decreased, the MR image has a characteristic of a decreased signal-to-noise ratio. Therefore, there is a problem that a high resolution 3D image has a restricted resolution due to the signal-to-noise ratio.

Figure 1:
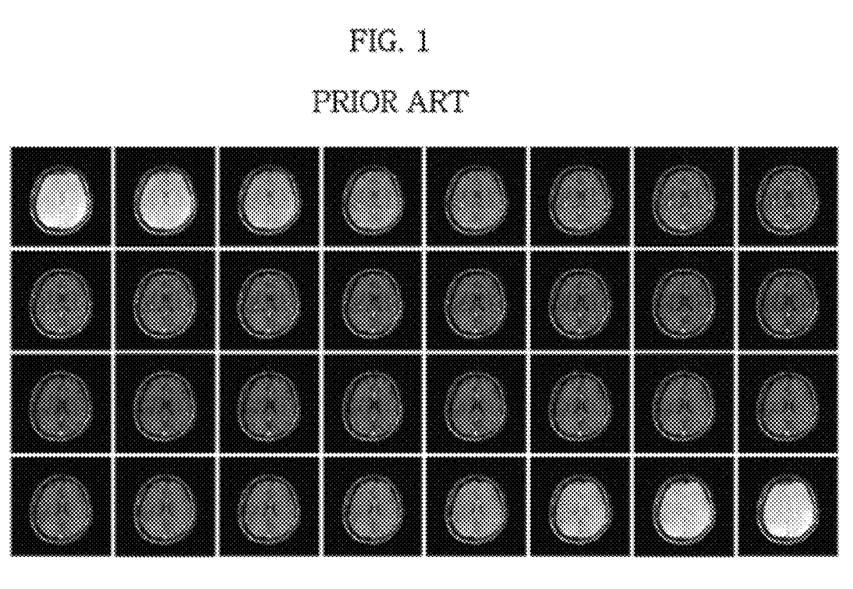
FIG. 1 is a view of showing an example for explaining a general method for reconstructing 3D images by using MRI of the related art.

FIG. 1 shows an example for explaining a general method for reconstructing 3D MR images of the related art.

The method for reconstructing 3D images by using MRI of the related art reconstructs the 3D images by exciting the region of interest, obtaining 3D frequency information, and performing the inverse Fourier transform.

However, referring to FIG. 1, slice images at beginning and end portions of the region of interest may show aliasing artifacts, which are images blurred or contaminated due to mixing of images outside the region of interest.

Since a truncated radio frequency pulse is commonly used in MRI, it is difficult to completely obtain signals of the preferred region of interest only. Therefore, a part outside the region of interest is excited, signals of the undesired part are added, and thus the aliasing artifacts are occurred. In addition, there is a problem to cause a field inhomogeneity artifact B0 that the signals of the region of interest are distorted and move to other regions due to non-uniformity of the main magnetic field caused by the magnetic property inside a human body.

DISCLOSURE

Technical Problem

In order to resolve the problems above, an object of embodiments of the invention is to provide an apparatus and a method for reconstructing 3D images by using 2D MR images obtained at different angles.

Other objectives of the present invention can be derived by the skilled person from the embodiments below.

Technical Solution

To achieve these and other advantages and in accordance with the purpose of embodiments of the invention, as embodied and broadly described, an apparatus for reconstructing 3D images by using magnetic resonance imaging (MRI) includes an image acquiring unit configured to acquire a plurality of 2D MR images about a region of interest of an object at different angles, respectively; and an image reconstructing unit configured to reconstruct the 3D images by using the plurality of MR images, wherein the plurality of MR images include information of a slice direction about the region of interest, which is changed depending on the different angles.

In another aspect, a method for reconstructing 3D images by using a plurality of MR images includes acquiring the plurality of 2D MR images about a region of interest of an object at different angles; and reconstructing the 3D images by using the plurality of MR images, wherein the plurality of MR images include information of a slice direction about the region of interest, which is changed depending on the different angles.

In another aspect, an apparatus for reconstructing 3D images includes an image acquiring unit configured to acquire a plurality of 2D MR images about a region of interest of an object at different angles; a pulse sequence controlling unit configured to add angle decision pulse sequences with different amplitudes to a slice selection gradient for deciding a change of a magnetic field of slice direction (z-direction) of the region of interest in order to acquire the plurality of MR images at the different angles; and 3D images reconstructing unit configured to reconstruct the 3D images by using the plurality of 2D MR images.

Advantageous Effects

According to the invention, since the 3D image is reconstructed by using the MR images acquired at different angles, the 3D image's may have a better SNR than the method for reconstructing 3D images of the related art.

Moreover, the overlapped parts at the boundary are decomposed by reconstructing the boundary region in addition to the region of interest, and thus it can be solved that the image is blurred and/or contaminated due to the aliasing artifacts.

Furthermore, the signals going beyond the region of interest due to the non-uniformity of the main magnetic field can be reconstructed, the non-uniformity of the main magnetic field can be estimated, and the information that the blood moves along the z-direction in the region of interest for the image acquisition time can be estimated.

DESCRIPTION OF DRAWINGS

The above and other objects, features and advantages of the present invention will become more apparent to those of ordinary skill in the art by describing in detail exemplary embodiments thereof with reference to the accompanying drawings, in which.

MODE FOR INVENTION

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In describing the drawings, like reference numerals refer to like components.

Certain embodiment of the invention will be described below in more detail with reference to the accompanying drawings.

Figure 2:
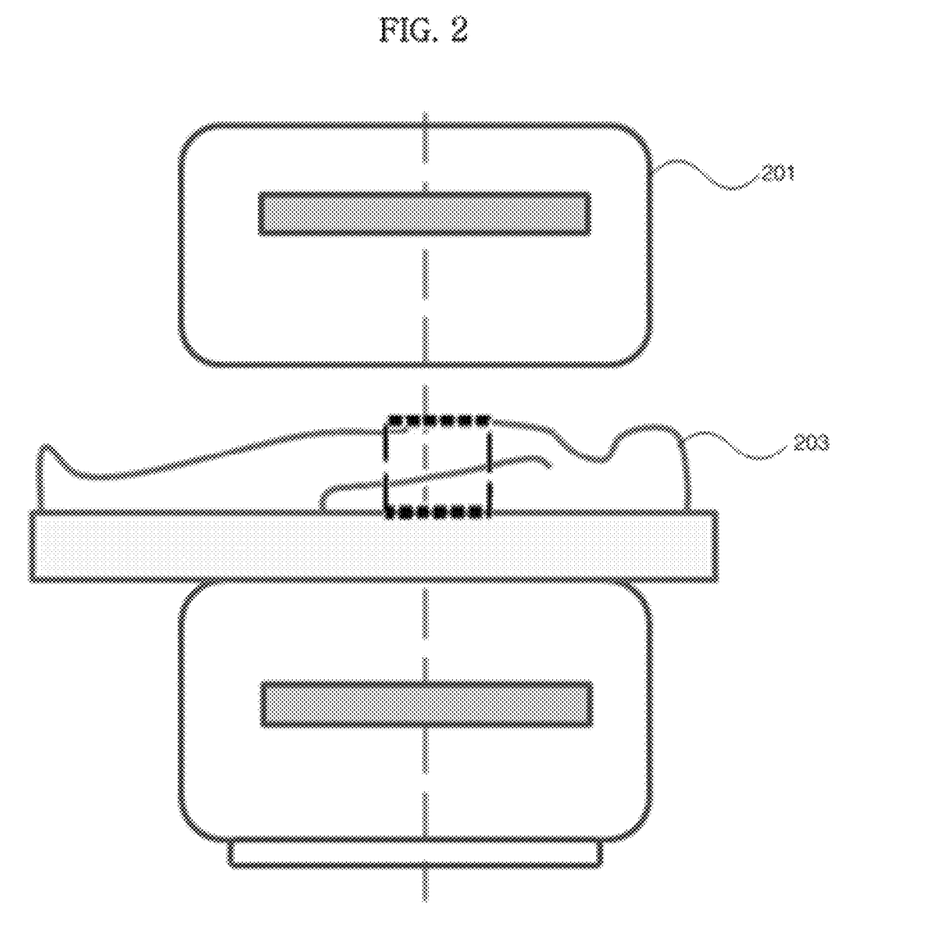
FIG. 2 is a view of illustrating an example of an apparatus for reconstructing a 3D image according to an exemplary embodiment of the invention.

FIG. 2 is a view of illustrating an example of an apparatus for reconstructing 3D images according to an exemplary embodiment of the invention.

Referring to FIG. 2, an apparatus for reconstructing 3D images 201 acquires a plurality of magnetic resonance images from a region of interest of an object 203 expressed with a dotted line and reconstructs 3D images using the plurality of 2D MR images.

The apparatus for reconstructing 3D images 201 may include a big magnetic container that generates a magnetic field.

The apparatus for reconstructing 3D images 201 may obtain the plurality of MR images by resonating hydrogen nuclei in the region of interest of the object 203 in the magnetic container using high frequency, measuring a difference of signals from each tissue, and reconstructing them through a computer.

That is, an MR image is an image that is formed by reconstructing magnetic properties of substances constituting the region of interest of the object 203 through a computer.

Figure 3:
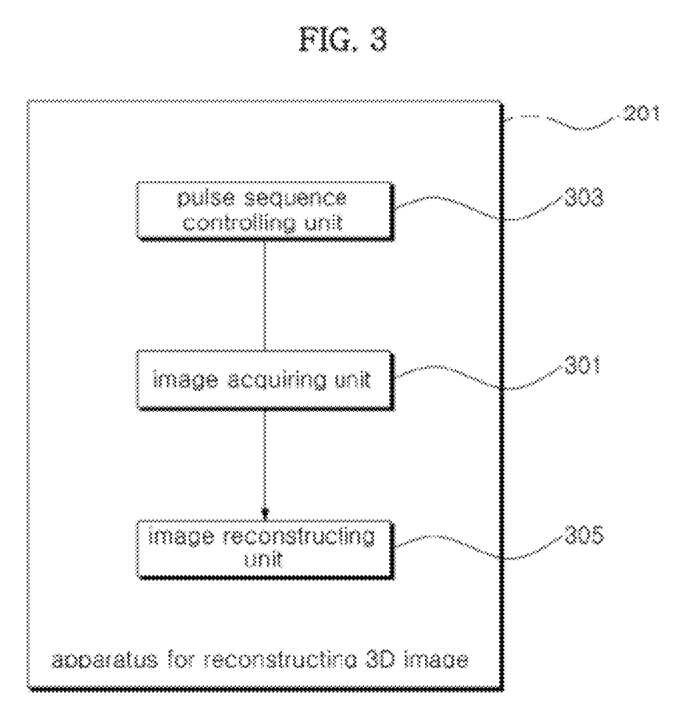
FIG. 3 is a block diagram of illustrating the detailed composition of an apparatus for reconstructing 3D images by using MRI according to an exemplary embodiment of the invention.

FIG. 3 is a block diagram of illustrating the detailed composition of an apparatus for reconstructing 3D images by using MRI according to an exemplary embodiment of the invention.

Referring to FIG. 3, the apparatus for reconstructing 3D images 201 includes an image acquiring unit 301, a pulse sequence controlling unit 303 and an image reconstructing unit 305.

The image acquiring unit 301 acquires a plurality of MR images including information along slice direction about a region of interest of an object 203 at different angles.

Here, the region of interest is defined by an x-y plane, which a flat surface of the region of interest, and a z-plane, which is a slab of the region of interest. The information along slice direction means image information about the region of interest along a z-direction.

The image acquiring unit 301 specifies the region of interest by using a change of a magnetic field in gradients and acquires MR images from the specified region of interest. The gradient field may be divided into three direction types with respect to x, y and z-axis and classified into a frequency encoding gradient, a phase encoding gradient, and a slice selection gradient depending on three directions, respectively.

According to the exemplary embodiment of the invention, the image acquiring unit 301 may specify the region of interest by using a pulse sequence of each gradient.

According to the invention, the image acquiring unit 301 changes the magnetic field along z-direction by using the slice selection gradient to select a slab of the region of interest. The resonance frequency at each region may show a slight difference due to application of the slice selection gradient, and slices of the region of interest may be flexibly selected with the difference. Namely, if the gradient is big, a thick slice may be selected, and if the gradient is small, a thin slice may be selected.

Subsequently, the image acquiring unit 301 changes the magnetic field of the y-direction by using the phase encoding gradient. That is, the phase encoding gradient divides the selected slices along the y-axis again, and spins have different phases depending on positions.

The image acquiring unit 301 changes the magnetic field of the x-direction by using the frequency encoding gradient. Therefore, the slices divided along the y-axis are re-divided by the frequency encoding gradient, and the region of interest with x, y, and z-axis are specified.

According to the exemplary embodiment of the invention, the MR image acquired by the image acquiring unit 301 may be a plane image, i.e., a 2-dimensional (2D) image.

The pulse sequence controlling unit 303 adds angle decision pulses having different amplitudes to the slice selection gradient that decide the change of the magnetic field in the region of interest along the z-direction in order to acquire the MR images at different angles.

Figure 4:
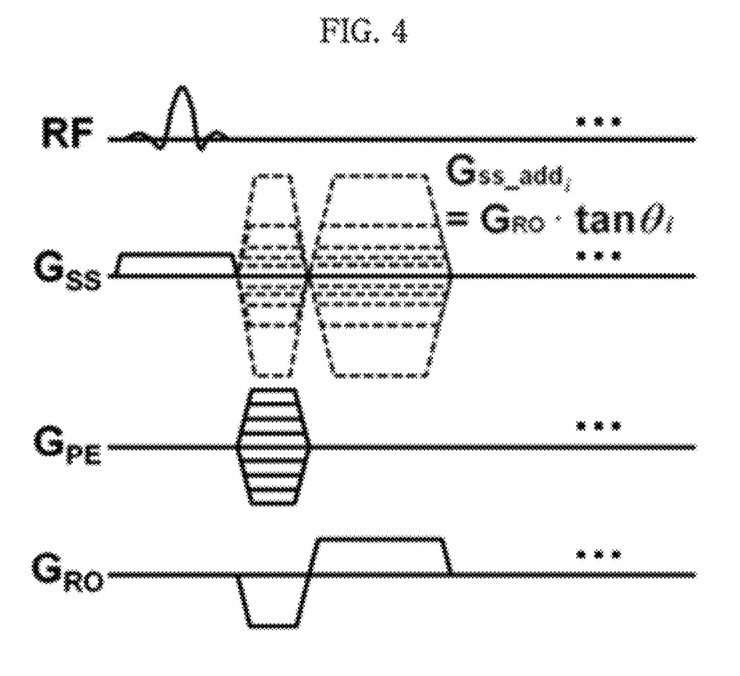
FIG. 4 is a view of illustrating a pulse sequence applied in order to acquire MR images in an image acquiring unit according to an exemplary embodiment of the invention.
Figure 5:
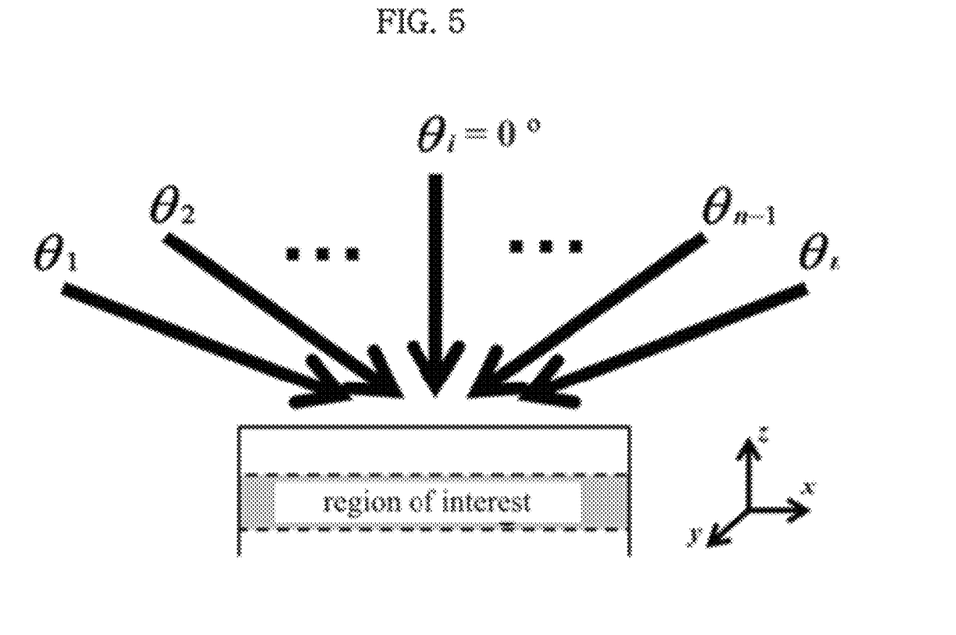
FIG. 5 is a view of explaining acquisition of MR images about the region of interest at different angles according to an exemplary embodiment of the invention.

FIG. 4 is a view of illustrating a pulse sequence applied in order to acquire MR images in an image acquiring unit according to an exemplary embodiment of the invention. FIG. 5 is a view of explaining acquisition of MR images about the region of interest at different angles according to an exemplary embodiment of the invention.

Referring to FIG. 4, the image acquiring unit 301 specifies the region of interest of FIG. 5 by using the slice selection gradient $G_{SS}$, the phase encoding gradient $G_{PE}$ and the frequency encoding gradient $G_{RO}$ expressed by black solid lines.

At this time, the pulse sequence controlling unit 303 controls acquisition angles of the MR images obtained by the image acquiring unit 301 by adding the angle decision gradients expressed by dotted lines to the slice selection gradient $G_{SS}$.

Here, the added angle decision gradients are decided by the frequency encoding gradient $G_{RO}$ and the acquisition angles of the MR images and are expressed by the following equation 1.

$$G_{SS\_add_i} = G_{RO} \cdot \tan \theta_i \quad \text{[Equation 1]}$$

Here, $G_{SS\_add_i}$ is an ith angle decision gradient, $G_{RO}$ is the frequency encoding gradient, and $\theta_i$ is the acquisition angle of an i-th acquired MR image.

According to the exemplary embodiment of the invention, the MR images acquired at different angles may include information of a slice direction of the region of interest.

The information of the slice direction means image information about the region of interest along the z-direction. The image acquiring unit 301 may divide the region of interest into a plurality of slices predetermined along the z-direction and may acquire MR images including the information of the slice direction by integrating the MR images about respective slices.

At this time, if the acquisition angle of the MR image is inclined with respect to the z-axis of the region of interest, the MR image acquired by the image acquiring unit 301 may be shown as an image in which upper and lower images of the region of interest along the z-direction are spread left and right and mixed.

Here, an MR image obtained at a specific acquisition angle may be expressed by the following equation 2.

$$MOV_\theta(x, y) = \sum_{i=1}^{n} m_i(x\ y) \otimes \delta(x - k_{i,\theta}\ y) \quad \text{[Equation 2]}$$

Here, $MOV_\theta(x,y)$ is an MR image including the information of the slice direction acquired at an angle $\theta$, n is the number of the slices about the region of interest, $m_i$ is a real image of an i-th slice, and $\delta(x-k_{i,\theta}\ y)$ is a shift impulse response of the i-th slice image along the x-axis at the angle $\theta$.

Referring to equation 2, the image may be expressed as a sum of convolutions of the shift impulse response decided by the real image on each slice and the angle.

Figure 6:
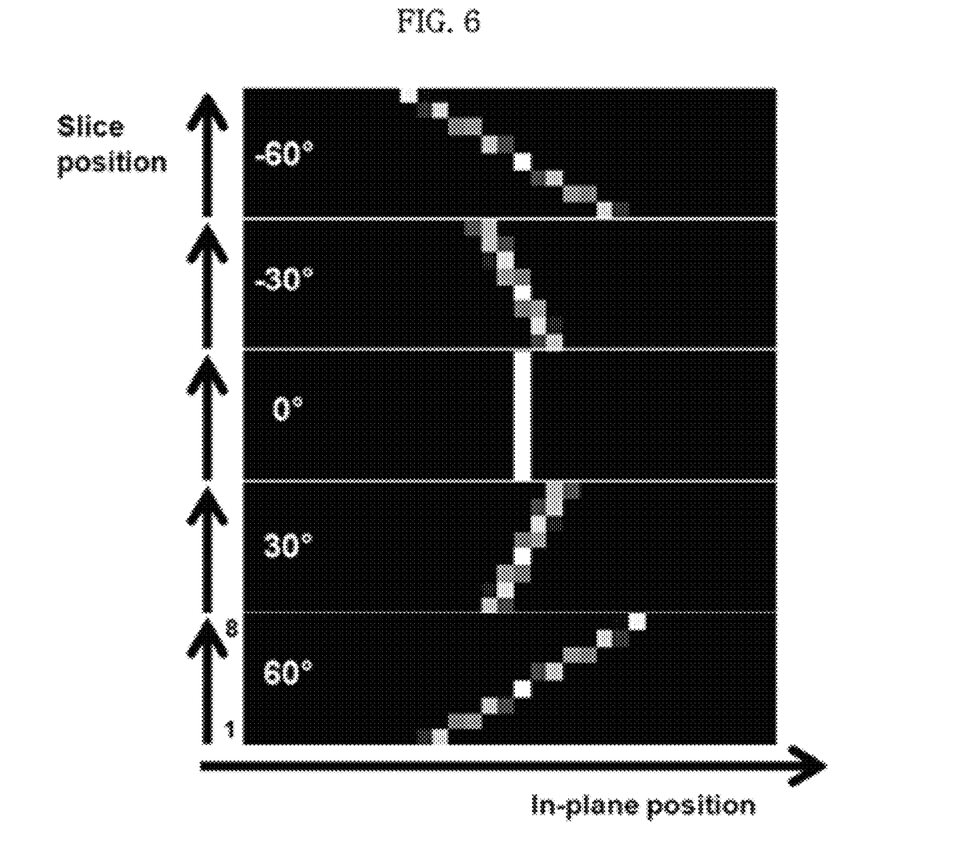
FIG. 6 is a view of explaining information of a slice direction according to an exemplary embodiment of the invention.
Figure 7:
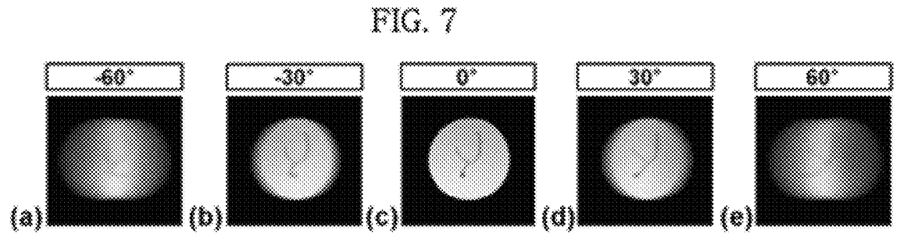
FIG. 7 is a view of illustrating an example of MR images acquired at different angles according to an exemplary embodiment of the invention.

FIG. 6 is a view of explaining information of a slice direction according to an exemplary embodiment of the invention, and FIG. 7 is a view of illustrating an example of MR images acquired at different angles according to an exemplary embodiment of the invention.

FIG. 6 shows shift impulse response images about eight slices acquired at each angle of −60°, −30°, 0°, 30°, and 60°, and FIG. 7 shows MR images obtained by using the pulse sequence of FIG. 4.

FIG. 7(a) to FIG. 7(e) are MR images acquired at respective angles of −60°, −30°, 0°, 30°, and 60°, and it is confirmed that upper and lower images of the region of interest along the z-direction are spread left and right.

Namely, referring to FIG. 6, the upper image of the region of interest along the z-direction is positioned on the left at −60°, and the lower image is positioned on the right. Thus, the left image of FIG. 7(a) means the upper image of the region of interest, and the right image of FIG. 7(a) means the lower image of the region of interest. On the contrary, the right image of FIG. 7(e) means the upper image of the region of interest.

It is confirmed that FIG. 7(c) is the MR image acquired at the angle of 0° and does not include the images spread left and right because the impulse response is not shifted left and right.

Referring to FIG. 3 again, the image reconstructing unit 305 reconstructs 3D images by using the MR images acquired at different angles.

Various methods using a plurality of 2D images may be used for 3D image reconstruction.

According to the exemplary embodiment of the invention, the image reconstructing unit 305 may reconstruct 3D images by using tomosynthesis techniques, which is a method for reconstructing 3D images from X-ray projection images acquired at various angles.

For Tomosynthesis, there are Shift-and-Add (SAA), Matrix inversion (MI) and Iterative back-projection (IBP) methods. The detailed explanations will be omitted because the methods are prior arts.

Since Tomosysthesis of the prior art uses x-ray images, noise of the projection images has properties of Poisson's distribution. Therefore, the noise may be more as a signal is stronger. On the other hand, the MR image according to the exemplary embodiment of the invention has a tendency that a signal to noise ratio (SNR) is better as the voxel is bigger during the scan. Therefore, images with the higher SNR may be reconstructed than a method for reconstructing 3D images by using X-ray images.

Moreover, the invention may reconstruct the more accurate image than 3D images reconstructed by using MRI of the related art because the 3D image is reconstructed by using the MR images acquired at different angles.

That is, in the method for reconstructing 3D images by using MRI of the related art, it is difficult to acquire precise images about an inclined region in the region of interest because 3D images is reconstructed by acquiring slice images of the region of interest along a vertical direction and then combining the acquired slice images. However, in the invention, precise images about the inclined region can be acquired because the MR images are obtained at various angles.

Figure 8:
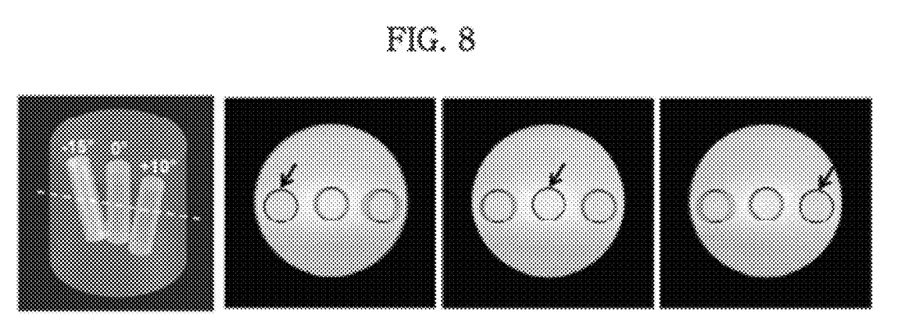
FIG. 8 is a view of explaining acquisition of images considering an inclined region in the region of interest according to an exemplary embodiment of the invention.

FIG. 8 is a view of explaining acquisition of images considering an inclined region in the region of interest according to an exemplary embodiment of the invention.

Referring to FIG. 8, in the case of assuming that specific regions in the region of interest are inclined to −15° and 10° as shown in FIG. 8, the method for reconstructing a 3D image by using MRI of the related art can acquire precise images only for a specific region remaining at 0°. However, in the invention, a more precise 3D image can be reconstructed because the 3D image is reconstructed by using the MR images at various angles and an inclination of the specific region can be considered.

Figure 9:
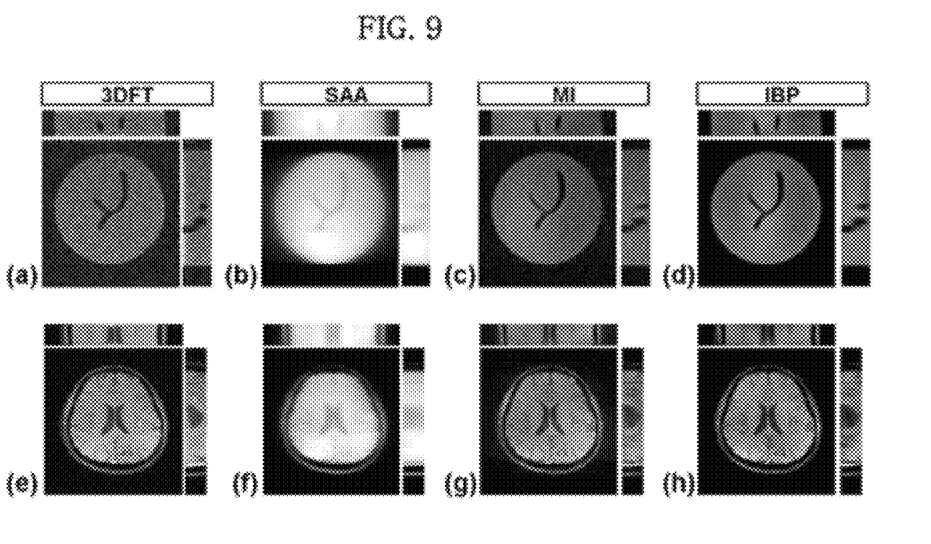
FIG. 9 is a view of illustrating 3D MR images reconstructed by applying a method for reconstructing 3D images according to the related art and a method for reconstructing 3D images using MR images at different angles according to an exemplary embodiment of the invention.

FIG. 9 is a view of illustrating 3D MR images reconstructed by applying a method for reconstructing 3D images according to the related art and a method for reconstructing 3D images using MR images at different angles according to an exemplary embodiment of the invention.

Referring to FIG. 9, FIG. 9(a) and FIG. 9(e) are 3D MR images reconstructed by applying inverse 3D Fourier transform (3DFT) method, which is a method for reconstructing 3D images according to the related art, FIG. 9(b) and FIG. 9(f) are 3D MR images reconstructed by applying an SAA method to a plurality of MR images acquired at different angles, FIG. 9(c) and FIG. 9(g) are 3D MR images reconstructed by applying an MI method to a plurality of MR images acquired at different angles, and FIG. 9(d) and FIG. 9(h) are 3D MR images reconstructed by applying an IBP method to a plurality of MR images acquired at different angles.

The SNRs of the reconstructed 3D MR images are SNRa=11.07, SNRb=178.02, SNRc=19.01, SNRd=24.38, SNRe=52.34, SNRf=867.08, SNRg=78.86 and SNRh=85.56. The reconstructed images have better SNRs than those reconstructed by applying the 3DFT method of the related art.

According to the exemplary embodiment of the invention, the image reconstructing unit 305 can also reconstruct an image of a boundary excluding the region of interest by using a plurality of MR images and effectively reconstruct 3D images because overlapped parts at the boundary in the reconstructed regions can be decomposed. Therefore, there is no aliasing artifact at the boundary of the region of interest.

Figure 10:
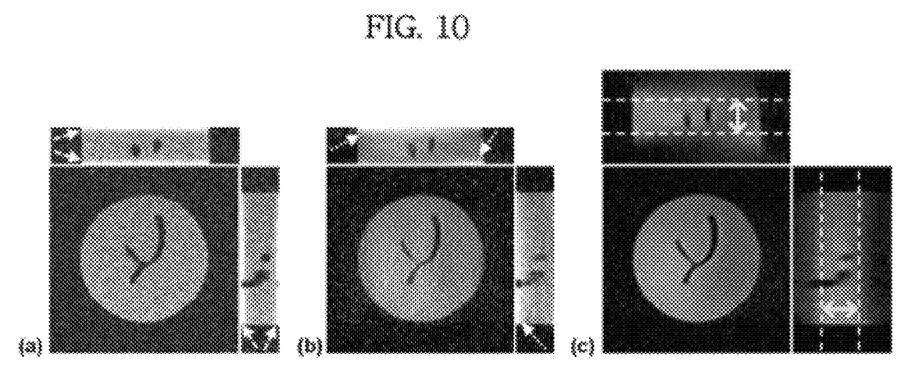
FIG. 10 is a view for explaining an aliasing artifact resolved in reconstructing 3D images.

FIG. 10 is a view for explaining an aliasing artifact generated in reconstructing 3D images.

Referring to FIG. 10, an image at the center means an image on the X-Y plane of the region of interest, and additional images at right and upper sides mean images on the z-axis plane of the region of interest.

FIG. 10(a) shows 3D images reconstructed by combining slice images of the region of interest along a vertical direction according to the related art, and the upper and lower slices of the 3D image are shown brightly as indicated by arrows because of the aliasing artifacts. FIG. 10(b) shows 3D images reconstructed by modeling without the aliasing artifacts considered according to an exemplary embodiment of the invention, and FIG. 10(c) shows 3D images reconstructed by modeling a spacious region with the aliasing artifacts considered.

In the case of the reconstructed 3D image of the related art, the aliasing artifacts are shown due to addition of undesired signals at the boundary of the region of interest. Therefore, in the related art, the slices showing the aliasing artifacts are not used and are thrown away.

However, in the invention, since the image reconstructing unit 305 also reconstructs the 3D image at the boundary excluding the region of interest by using the plurality of MR images and the overlapped parts can be decomposed, there is an advantage that the 3D image without any aliasing artifact can be reconstructed.

Additionally, according to the exemplary embodiment of the invention, the image at the boundary is not wasted, and time benefit can be obtained. It is useful to acquire an image having higher definition because the SNR is also better.

Figure 11:
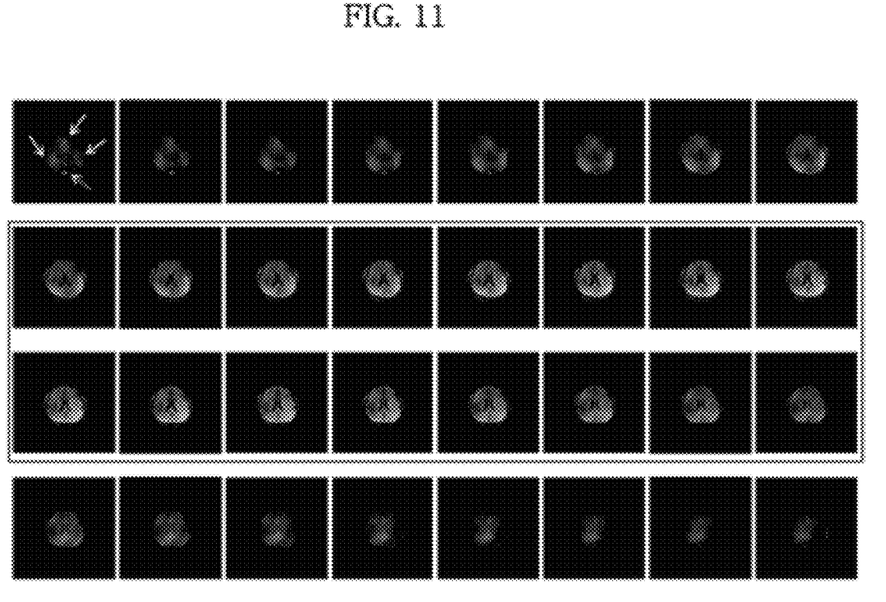
FIG. 11 is a view of explaining signals distorted outside a region of interest due to non-uniformity of a main magnetic field.

FIG. 11 is a view of explaining signals distorted outside a region of interest due to non-uniformity of a main magnetic field.

In the case of an MR image, there occurs a field inhomogeneity artifact B0 that signals of the region of interest are distorted and move to other regions due to non-uniformity of the main magnetic field caused by the magnetism inside a body.

Referring to FIG. 11, a rectangular box means images acquired about the region of interest and the arrows indicate the signal distorted outside the region of interest due to the non-uniformity of the main magnetic field.

Since the image reconstructing unit 305 of the invention reconstructs the boundary region in addition to the region of interest, the signals going beyond the region of interest due to the non-uniformity of the main magnetic field can be reconstructed, and thus the non-uniformity of the main magnetic field can be estimated.

Moreover, in FIG. 11, the dotted arrow expresses a blood signal flowing along a blood vessel. It is estimated that the blood vessel moves along the z-direction by using the reconstructed images at the boundary because the blood signal is excited in the region of interest and moves for an image acquisition time.

Figure 12:
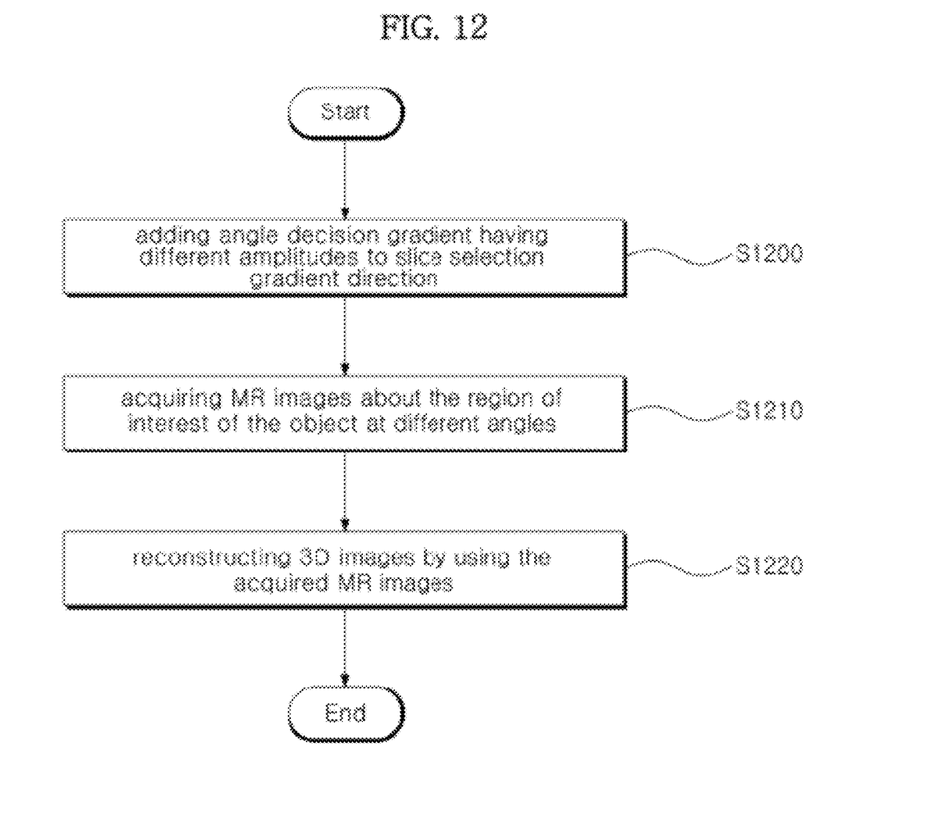
FIG. 12 is a flow chart of illustrating entire processes of a method for reconstructing 3D images by using MR images according to an exemplary embodiment of the invention.

FIG. 12 is a flow chart of illustrating entire processes of a method for reconstructing 3D images by using MR images according to an exemplary embodiment of the invention.

First, at step S1200, angle decision gradient having different amplitudes are added to a slice selection gradient, which decides the change of the magnetic field in the region of interest along the z-direction, in order to acquire a plurality of MR images at different angles.

At step S1210, the plurality of MR images about the region of interest of the object at the different angles are acquired by using the slice selection gradient.

The region of interest is formed by an x-y plane, which is a flat surface of the region of interest, and a z-plane, which is a thickness of the region of interest, and the information of the slice direction means image information about the region of interest along the z-direction.

According to the exemplary embodiment of the invention, at step S1210, the region of interest is divided into slices predetermined along the z-direction, and the MR images including the information of the slice direction can be acquired by using an MR image for each slice.

Finally, at step S1220, 3D images are reconstructed by using the plurality of MR images.

According to the exemplary embodiment of the invention, at step S1220, the plurality of MR images are reconstructed into the 3D image by using at least one of Shift-and-Add (SAA), Matrix inversion (MI) and Iterative back-projection (IBP) techniques for reconstructing 2D images into 3D images.

While the invention has been described above using particular items, such as specific components, etc., and limited embodiments and drawings, these are merely provided to aid the overall understanding of the invention. The invention is not to be limited to the above embodiments, and those of ordinary skill in the art may conceive various modifications and alterations from the above disclosure. As such, the spirit of the invention is not to be defined only by the embodiments described above, and it is to be appreciated that not only the scope of claims set forth below but also their equivalents and substantially equivalent variations are encompassed within the spirit of the invention.

The invention claimed is:

1. An apparatus for reconstructing 3D images by using magnetic resonance imaging (MRI), comprising:
    an image acquiring unit configured to acquire a plurality of magnetic resonance (MR) images about a region of interest of an object at different angles, respectively, wherein the region of interest is defined by an x-y plane, which is a flat surface of the region of interest, and a z-plane, which is a slab of the region of interest;
    an image reconstructing unit configure to reconstruct the 3D image by using the plurality of MR images, wherein the plurality of MR images include information of a slice direction about the region of interest, which is changed depending on the different angles; and
    a pulse sequence controlling unit configured to add angle decision gradient having different amplitudes to slice selection gradient that decides a change of a magnetic field in the region of interest along the z-direction in order to acquire the plurality of MR images at the different angles, wherein the angle decision gradients are determined by using a frequency encoding gradient for deciding a change of a magnetic field in the region of interest along an x-direction and the acquisition angles of the MR images and wherein the angle decision gradients are expressed by the following equation;

$$G_{SS\_add_i} = G_{RO} \cdot \tan \theta_i,$$

wherein $G_{SS\_add_i}$ is an ith angle decision gradient, $G_{RO}$ is the frequency encoding gradient, $\theta_i$ and is the acquisition angle of an ith acquired MR image.

2. The apparatus according to claim 1, wherein the information of the slice direction means image information about the region of interest along a z-direction, and wherein the image acquiring unit divides the region of interest into a plurality of slices predetermined along the z-direction and acquires the plurality of MR images including the information of the slice direction by integrating MR images about respective slices.

3. The apparatus according to claim 2, wherein when an acquisition angle of the MR image is inclined with respect to a z-axis, the MR image is expressed as an image in which upper and lower images of the region of interest along the z-direction are spread left and right and combined.

4. The apparatus according to claim 1, wherein the plurality of MR images are expressed by a following equation;

$$MOV_\theta(x, y) = \sum_{i=1}^{n} m_i(x\ y) \otimes \delta(x - k_{i,\theta}\ y),$$

wherein $MOV_\theta(x,y)$ is an MR image including the information of the slice direction acquired at an angle $\theta$, n is the number of the slices about the region of interest, $m_i$ is a real image of an i th slice, and $\delta(x-k_{i,\theta}\ y)$ is a shift impulse response image of the i th slice image along an x-axis at the angle $\theta$.

5. The apparatus according to claim 1, wherein the image reconstructing unit reconstructs the plurality of MR images into the 3D image by using at least one of Shift-and-Add (SAA), Matrix inversion (MI) and Iterative back-projection (IBP) techniques.

6. The apparatus according to claim 1, wherein the image reconstructing unit reconstructs the region of interest and a boundary region of the region of interest by using the plurality of MR images and decomposes overlapped parts at the boundary region in reconstructed regions.

7. A method for reconstructing 3D images by using a plurality of MR images, comprising:
acquiring the plurality of magnetic resonance (MR) images about a region of interest of an object at different angles, wherein the region of interest is defined by an x-y plane, which is a flat surface of the region of interest and a z-plane, which is a slab of the region of interest;
reconstructing the 3D image by using the plurality of MR images, wherein the plurality of MR images include information of a slice direction about the region of interest, which is changed depending on the different angles;
adding angle decision gradients having different amplitudes to a slice selection gradient that decides a change of a magnetic field in the region of interest along the z-direction in order to acquire the plurality of MR images at the different angles, wherein the angle decision gradients are determined by using a frequency encoding gradient for deciding a change of a magnetic field in the region of interest along an x-direction and the acquisition angles of the MR images and wherein the angle decision gradients are expressed by the following equation;

$$G_{SS\_add_i} = G_{RO} \cdot \tan \theta_i,$$

wherein $G_{SS\_add_i}$ is an ith angle decision gradient, $G_{RO}$ is the frequency encoding gradient, and $\theta_i$ is the acquisition angle of an ith acquired MR image.

8. The method according to claim 7, wherein the information of the slice direction means image information about the region of interest along a z-direction, and wherein an image acquiring unit divides the region of interest into a plurality of slices predetermined along the z-direction and acquires the plurality of MR images including the information of the slice direction by integrating MR images about respective slices.

9. The method according to claim 7, wherein the step of reconstructing the 3D image uses at least one of Shift-and-Add (SAA), Matrix inversion (MI) and Iterative back-projection (IBP) techniques to reconstruct 2D images into the 3D images.

* * * * *